United States Patent

Salvi et al.

[11] Patent Number: 5,831,482
[45] Date of Patent: Nov. 3, 1998

[54] METHOD AND APPARATUS FOR SELF-TUNING A VOLTAGE CONTROLLED OSCILLATOR (VCO)

[75] Inventors: Raul Salvi, Boca Raton; Gustavo D. Leizerovich, Miami Lakes, both of Fla.

[73] Assignee: Motorola, Inc., Schaumburg, Ill.

[21] Appl. No.: 810,279

[22] Filed: Mar. 3, 1997

[51] Int. Cl.$^6$ ....................................................... H03L 7/00
[52] U.S. Cl. ............................... 331/1 R; 331/16; 331/25
[58] Field of Search ........................ 331/1 R, 25, DIG. 2, 331/177 R, 17, 16

[56] References Cited

U.S. PATENT DOCUMENTS

| | | | |
|---|---|---|---|
| 4,635,103 | 1/1987 | Steckler et al. | 358/27 |
| 4,963,839 | 10/1990 | Stacey | 331/17 |
| 5,258,724 | 11/1993 | Tanis et al. | 331/25 X |
| 5,555,276 | 9/1996 | Koenck et al. | 375/303 |

*Primary Examiner*—Huan Hoang
*Attorney, Agent, or Firm*—Val Jean F. Hillman

[57] ABSTRACT

A method and apparatus for tuning the voltage controlled oscillator (VCO) (110) of a Phase Locked Loop (100) by comparing the VCO (110) voltage control line (116) to reference voltage ($V_1$). With feedback, the voltage control line (116) is driven to the reference voltage level ($V_1$).

12 Claims, 4 Drawing Sheets

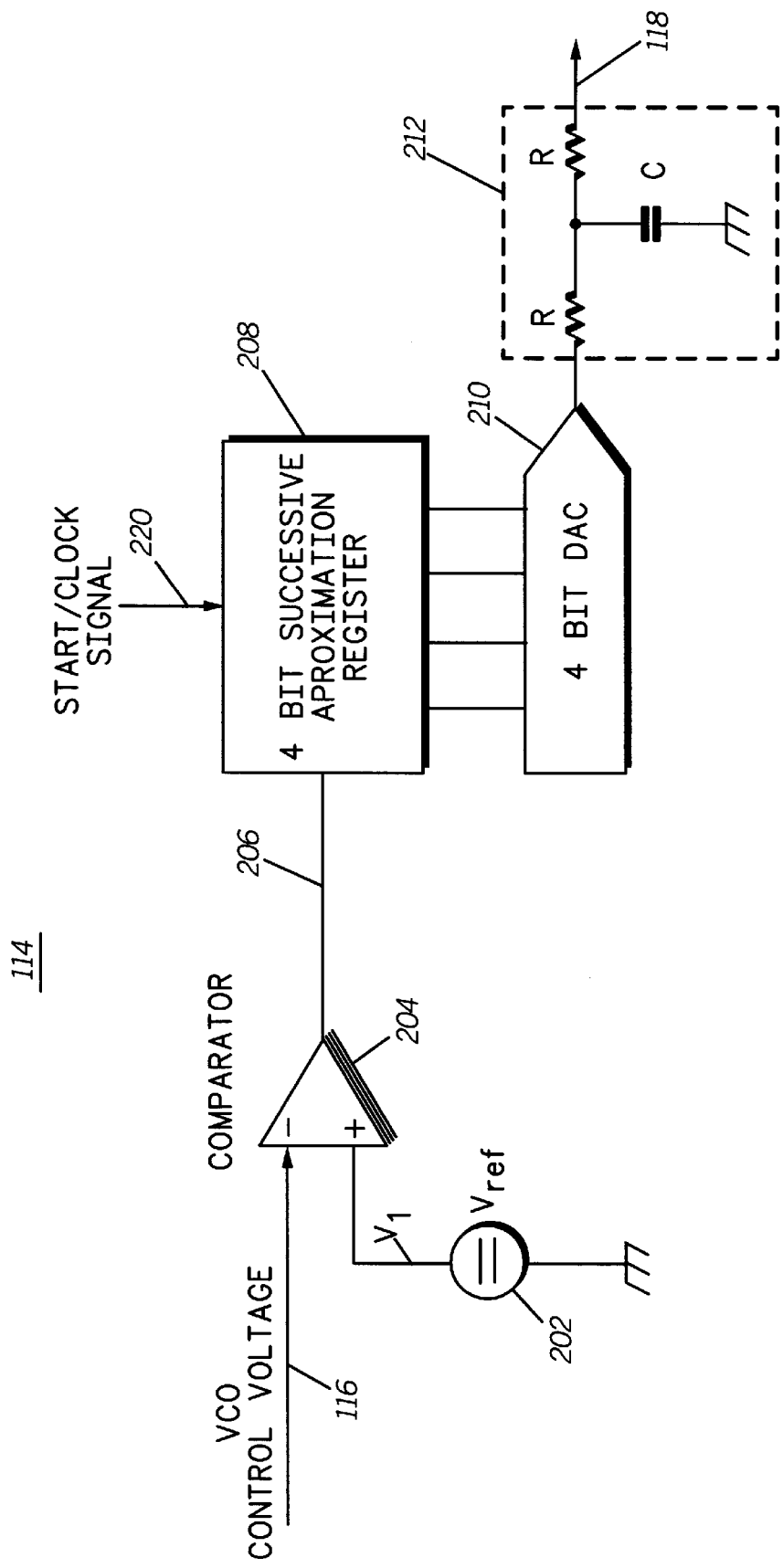

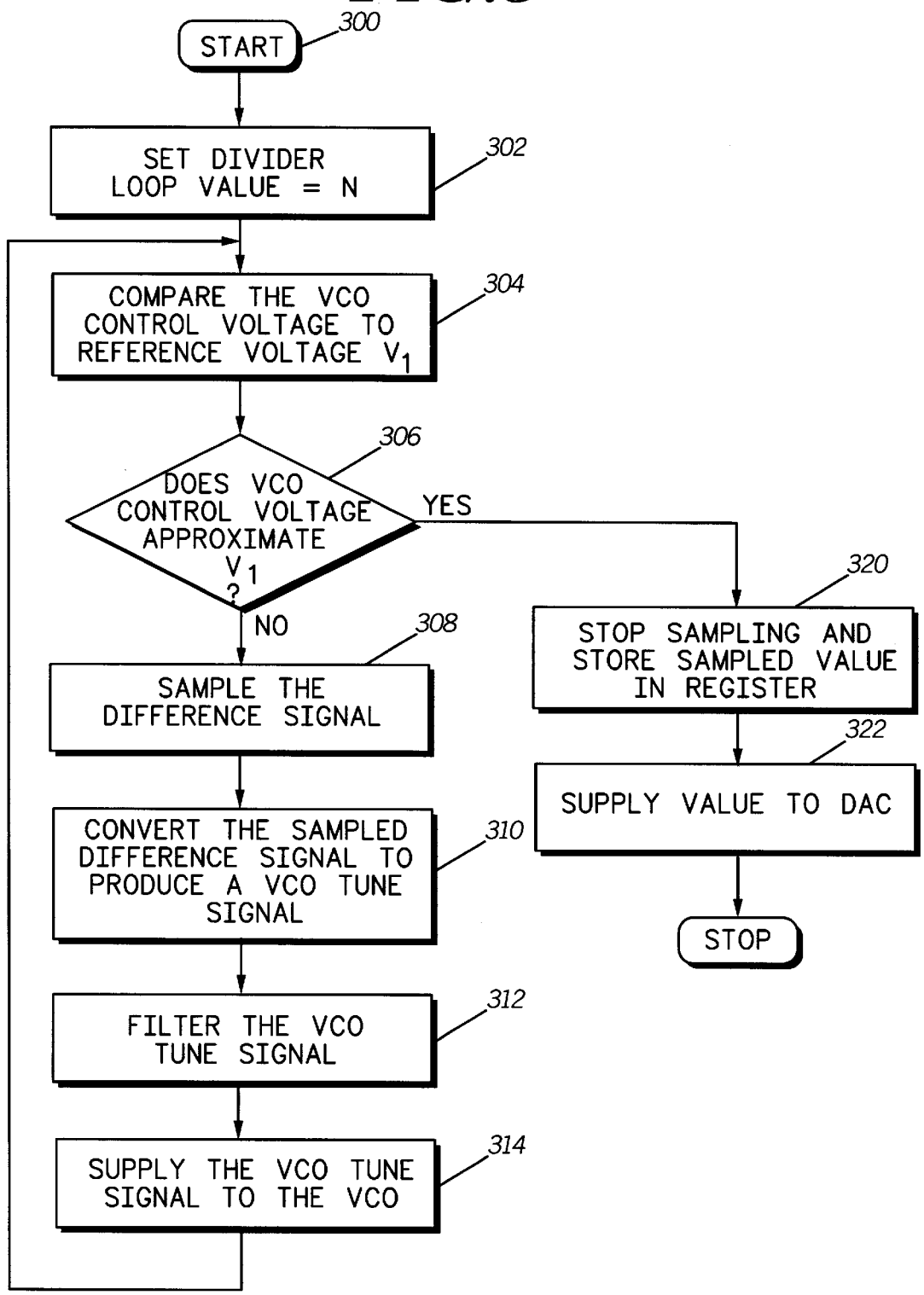

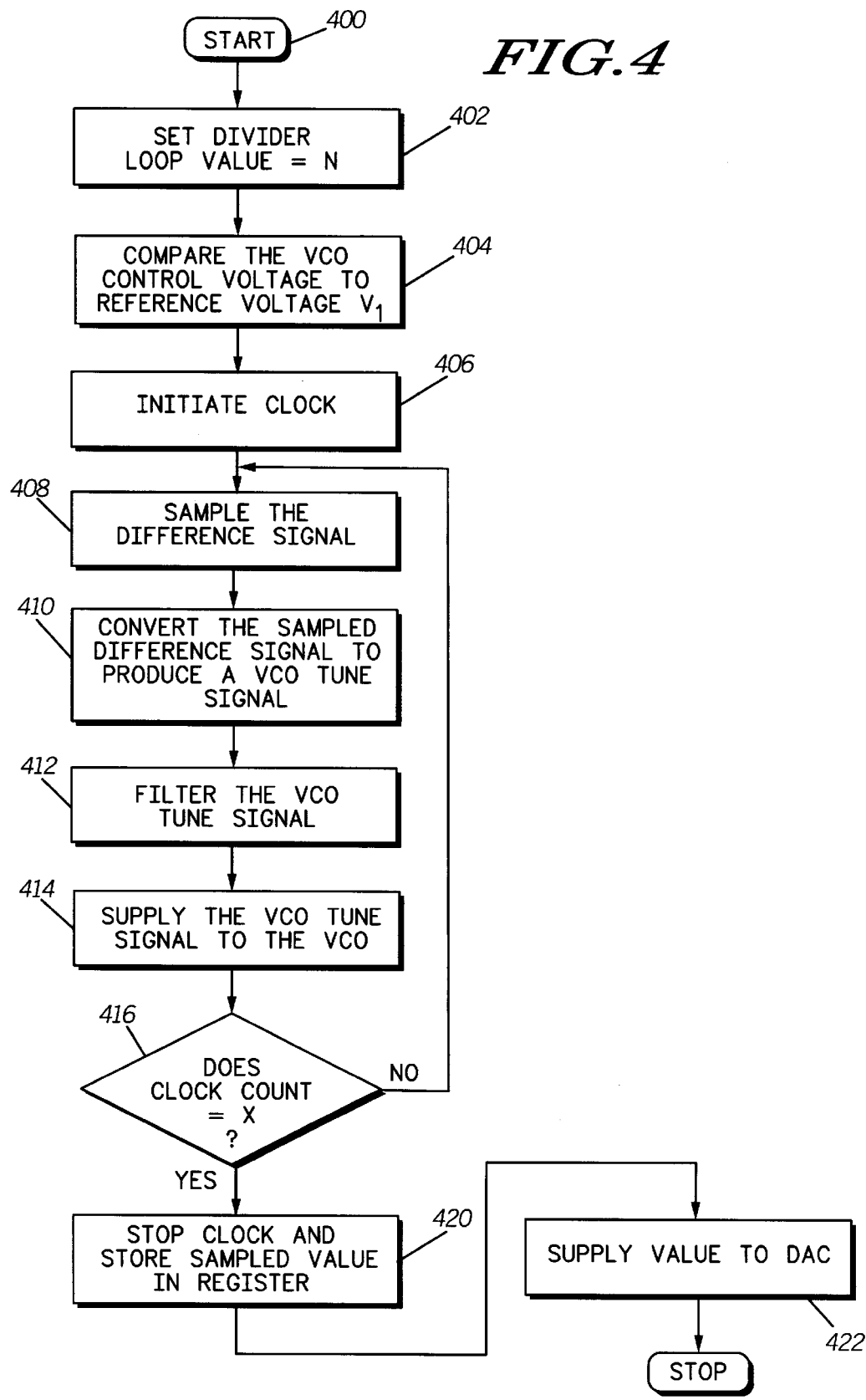

5,831,482

METHOD AND APPARATUS FOR SELF-TUNING A VOLTAGE CONTROLLED OSCILLATOR (VCO)

TECHNICAL FIELD

This invention relates in general to frequency synthesizer circuits and particularly to Phase Locked Loop (PLL) frequency synthesizers. Specifically, the present invention relates to a method and apparatus for tuning the voltage controlled oscillator (VCO) used in a PLL frequency synthesizer.

BACKGROUND

Phase Locked Loop (PLL) frequency synthesizers are well known in the art. One of the frequent components of a conventional PLL frequency synthesizer is a voltage controlled oscillator (VCO). The primary function of the VCO is to provide a frequency response output as a function of voltage input signal amplitude. Despite the numerous advantages associated with using a VCO in a PLL design, one basic shortcoming is the requirement to tune or center the VCO frequency response around a desired bandwidth of operation. As will be appreciated, failure to properly tune the VCO may result in unpredictable frequency responses during operation.

Traditional methods for VCO tuning rely heavily on mechanical and/or manual procedures for centering the VCO frequency response. Such methods include the steps of: 1) monitoring the VCO output frequency in response to a given VCO control voltage, or 2) monitoring the VCO control voltage at a given frequency response, and then 3) mechanically adjusting or laser trimming the capacitance of a capacitor connected in parallel with the oscillator tank of the VCO to shift or center the VCO's bandwidth.

As will be appreciated, such manual tuning operations are typically labor intensive, expensive, and susceptible to environmentally induced variations such as temperature, humidity, altitude, etc. It would be extremely advantageous therefore to provide a VCO tuning method and apparatus for use with PLL circuits and other frequency synthesizer applications, seeking to avoid the shortcomings of the prior art while providing a robust band-centering self-tuning VCO.

BRIEF DESCRIPTION OF THE DRAWINGS

FIG. 2 is a detailed circuit diagram of the VCO band tuning circuit of FIG. 1;

FIG. 3 is a flow chart diagram of the steps performed by a logic controlled device utilizing the PLL circuit of FIG. 1 to produce a frequency response.

FIG. 4 is a flowchart diagram of an alternate set of steps formed by a logic control device utilizing the PLL circuit of FIG. 1 to produce a frequency response.

DETAILED DESCRIPTION OF THE PREFERRED EMBODIMENT

Figure 1:
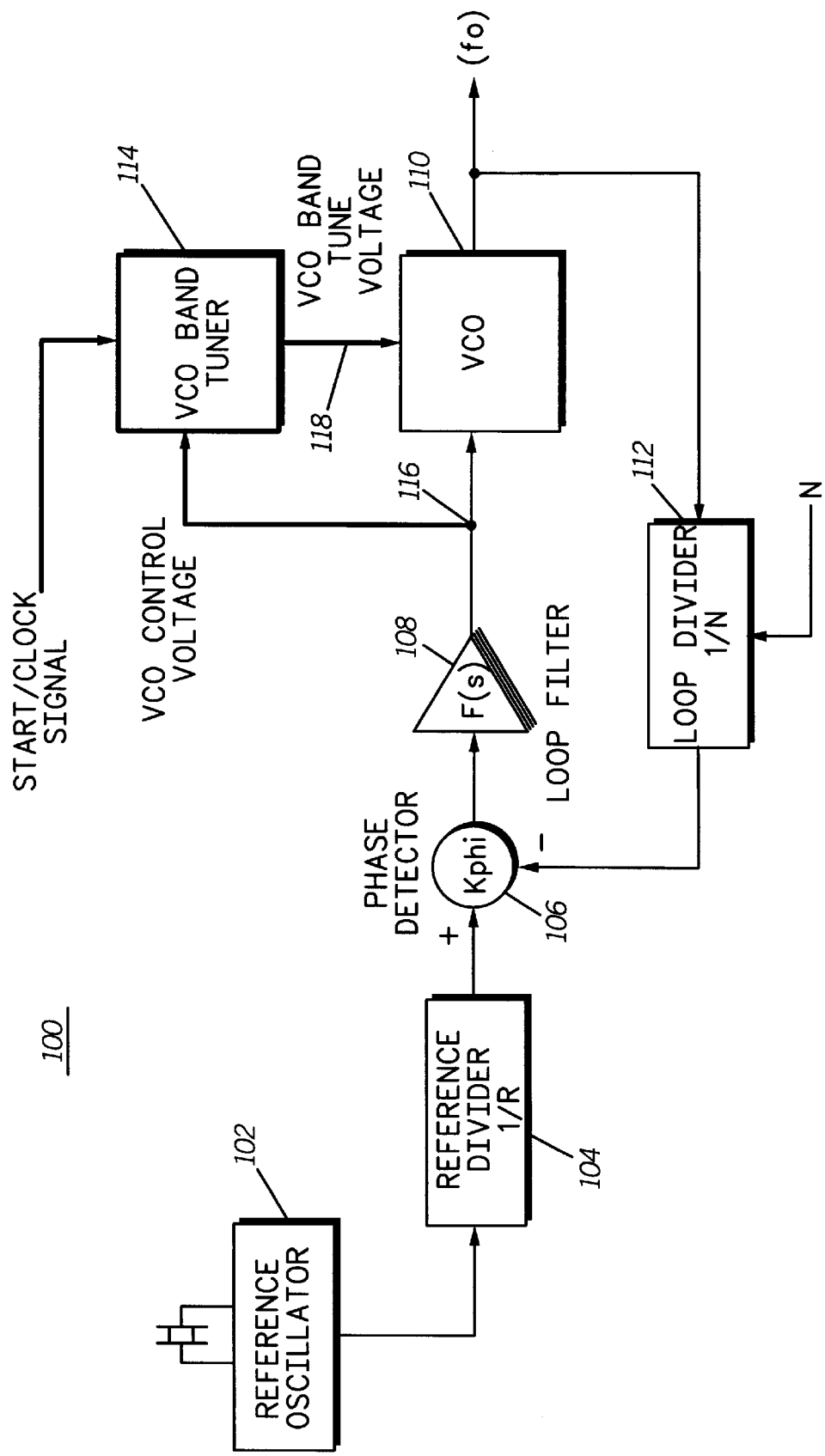
FIG. 1 is a block diagram of a Phase-Locked Loop (PLL) circuit employing the VCO band tuning circuit of the present invention.

While the specification concludes with claims defining the features of the invention that are regarded as novel, it is believed that the invention will be better understood from a consideration of the following description in conjunction with the drawing figures, in which like reference numerals are carried forward.

FIG. 1 is a block diagram of Phase Locked Loop (PLL) circuit 100 employing the VCO band tuning circuit 114 of the present invention. As depicted, PLL circuit 100 employs a reference oscillator 102, reference divider 104, phase detector 106, loop filter 108, VCO 110, and loop divider 112. Such circuits are known in the art and will not, therefore, be described in great detail. The interested reader may refer to U.S. Pat. No. 4,975,650 Martin, issued Dec. 4, 1990, and assigned to the assignee of the present application, for additional detail on circuit 100 theory, design, and operation. Suffice it to say, however, VCO output ($f_o$) is established by setting or programming the value N of loop divider 112.

During operation, the VCO band tuner 114 of the present invention operates to set the VCO band tune voltage 118 such that the VCO control voltage 116 is equal to a known reference voltage $V_1$. Through empirical data, $V_1$ is the expected VCO control voltage when the VCO 110 is in tune. In accordance, VCO band tune circuit 114 operates to adjust the voltage level of VCO band tune voltage 118. The loop circuit 100 simultaneously operates to control the VCO control voltage 116.

FIG. 2 is a detailed circuit diagram of the VCO band tune circuit 114 of FIG. 1. Band tune circuit 114 includes comparator 204 which compares the VCO control voltage 116 to a reference voltage $V_1$ as established by voltage reference 202. Assuming the reference voltage generator 202 is a variable voltage device, band tune circuit 114 will provide a variable tune. If the reference generator 202 is programmable, the tune circuit 114 can be programmed across a range of values.

The comparator output 210 is a difference signal that represents the difference between V1 and the VCO control voltage 116. In order to reach proper VCO tune, VCO control voltage 116 should equal $V_1$. To achieve this end, the difference signal 206 is presented to a Successive Approximation Register (SAR) circuit 208. In accordance with the present embodiment, SAR circuit 208 is a 4 bit up/down counter like the MC 14029B known in the art. Despite the choice of the preferred embodiment, it will be appreciated by those skilled in the art that any circuit now available or later developed capable of sampling an analog signal, digitizing the samples, and then storing the results can be used in place of the SAR circuit 208, without departing from the spirit of the present invention. While the present invention discloses a 4 bit up/down counter, it will be appreciated by those skilled in the art that another type counter can be substituted therefore.

Of importance, the sampling rate of the SAR circuit 208, as determined by the clock signal 220, must be lower than the rate as established by the PLL lock time. As an example, if we assume the PLL lock time is 0.1 milliseconds, then the sampling time of the clock signal 220 must be greater than 0.1 milliseconds, for example, 0.3 milliseconds. Said another way the sample rate of the clock signal 220 is slower then the rate as established by the PLL lock time, so as to ensure the PLL control voltage is able to be updated to reflect changes in VCO tuning.

From SAR 208, a 4 bit digitized version of the difference signal from comparator 204 is communicated to 4 bit digital-to-analog converter (DAC) 210. DAC 210 provides an analog output to low pass filter 212, which filters the DAC 210 output prior to delivery to a varactor (not shown) on the VCO 110 of FIG. 1. DAC output 210 drives the varactor in order to tune the VCO. As the VCO 110 is tuned with the PLL locked, the phase detector 106 output control voltage shifts towards reference voltage $V_1$ which is the anticipated and predetermined control line 116 voltage for a given programmed frequency ($f_o$).

When the VCO control voltage 116 reaches the level of $V_1$, the clock pulse generator (not shown) which supplies the clock signal 220 is disabled and the counter 208 will hold that output voltage and the VCO 110 will be in tune. Based on the specific counter 208, this will occur at a defined number of clock cycles.

FIG. 3 is a flow chart diagram of the steps performed by a logic controlled or computer controlled device such as a wireless communicator, two-way radio, radiotelephone, pager, or any other device using a phase locked loop frequency synthesizer to tune a VCO in accordance with the present invention. Commencing at start block 300, flow proceeds to block 302 where the PLL loop divider 112 value N is set to a value that provides a desired output frequency ($f_o$) from the VCO 110. From block 302 flow proceeds to block 304 where the comparator 204 compares the VCO control voltage 116 to a reference voltage $V_1$. At block 306, a determination is made whether the VCO control voltage 116 approximates the reference voltage $V_1$. If not, flow proceeds to block 308 where the counter 208 digitizes the difference signal output by comparator 204.

From block 308, flow proceeds to block 310 where the counter output is converted by DAC 210 to an analog version of the difference signal. From block 310, flow proceeds to block 312 where the DAC 210 output is filtered by a low pass filter 212 in order to remove unwanted noise components. From block 312, flow process to block 314 where the filtered DAC signal 118 is supplied to VCO 110 as a tune signal.

From block 314, flow branches back to block 304 where the process continues until at block 306 the VCO control voltage 116 approaches the value of $V_1$. Upon this condition, the VCO is determined to be in tune and the flow branches from block 306 to block 320 where the counter 208 stops counting and holds the sample value in a register and at block 322 supplies DAC 210 with the stored value.

With reference to FIG. 4., assuming one knows the number of clock cycles it will take before control voltage 116 will approximate the reference voltage $V_1$, an alternative approach is available. Commencing with start block 400, flow proceeds to block 404 which steps are identical to the steps of blocks 300–304 of FIG. 3. At block 406 of FIG. 4, a clock signal generator is initiated to start delivering clock signals to the VCO band tune circuit 114. From block 408, flow proceeds through block 414 which steps are identical to the steps of blocks 308–314 of FIG. 3.

Referring back to FIG. 4, flow proceeds from block 414 to 416 where a check is performed to determine if a predetermined clock count has been reached. If not, flow branches back to block 408 where the steps of blocks 408–416 are repeated until the appropriate time has elapsed. Upon this condition, the VCO is determined to be in tune and flow branches forward to blocks 420 and 422 which are identical to the steps of blocks 320 and 322 of FIG. 3. Otherwise, the steps of block 408–416 are repeated.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

Notwithstanding, it will be appreciated by those skilled in the art that the invention of the present application operates to provide a self-tuning VCO that avoids the limitations of the prior art; namely, manual, labor intensive, high-cost, and error-prone VCO tuning.

What is claimed is:

1. A tuning circuit for Voltage Control Oscillator (VCO) comprising:

a comparator for generating a difference signal from a first control signal and a reference signal;

a Successive Approximation Register (SAR) circuit coupled to the comparator, for sampling the difference signal and providing a digitized output; and a converter, coupled to the SAR circuit, for converting the digitized output into a second control signal for delivery to the VCO.

2. A self-tuning Phase Lock Loop (PLL) circuit having a voltage controlled oscillator (VCO), said circuit further comprising:

a comparator for receiving a VCO control voltage, comparing the VCO control voltage to a reference signal, and providing a difference signal;

a counter coupled to the comparator, for sampling the difference signal and providing a digitized output;

a converter coupled to the counter for converting the digitized output into a VCO tune signal; and a filter coupled to the converter and the VCO for filtering the VCO tune signal.

3. The circuit of claim 2, wherein the counter is an up/down binary counter.

4. The circuit of claim 2, wherein the converter is a digital-to-analog converter.

5. The circuit of claim 2, wherein the filter is a Low Pass Filter.

6. The circuit of claim 3, wherein the counter samples the difference signal for a predetermined number of clock cycles approximating a time required for the VCO to reach a tuned state.

7. A wireless communications device having a phase locked loop frequency synthesizer comprising:

a voltage controlled oscillator (VCO) for receiving a control signal and providing an output signal ($f_o$) and further adapted to receive a tuning control signal;

a comparator for receiving the control signal and comparing the control signal to a reference signal to provide a difference signal a Successive Approximation Register (SAR) circuit coupled to the comparator for sampling the difference signal to provide a digitized output;

a converter coupled to the SAR circuit for converting the digitized output into the tuning control signal; and a filter coupled to the converter and the VCO for filtering the tuning control circuit.

8. The device of claim 7, wherein the control signal and the reference signal are voltage signals.

9. The device of claim 7, wherein the SAR circuit samples the difference signal for a predetermined number of clock cycles approximating a time required for the VCO to reach a tuned state.

10. A method for tuning a Voltage Controlled Oscillator (VCO) in a Phase Locked Loop (PLL) frequency synthesizer comprising the steps of:

setting a PLL divider to produce an expected VCO frequency output;

comparing a VCO control voltage to a reference voltage to produce a difference signal;

sampling the difference signal at a rate lower than a rate established by the phase locked loop's lock time to generate a sample signal;

converting the sampled signal into VCO tuning signal;

filtering the VCO tuning signal to remove noise; and supplying the VCO tuning signal to the VCO, in order to drive the VCO control voltage value towards the reference voltage value.

11. The method of claim 10, further comprising the step of:

sampling the difference signal at a rate longer in duration than the duration established by the phase locked loop's lock time.

12. The method of claim 10, further comprising the step of:

sampling the difference signal at a rate slower than the rate established by the phase locked loop's lock time.

* * * * *